US008509036B2

(12) United States Patent
Shimazawa et al.

(10) Patent No.: US 8,509,036 B2
(45) Date of Patent: Aug. 13, 2013

(54) METHOD OF BURN-IN TESTING FOR THERMALLY ASSISTED HEAD

(75) Inventors: Koji Shimazawa, Tokyo (JP); Kosuke Tanaka, Tokyo (JP); Ryuji Fujii, Hong Kong (CN); Takashi Honda, Hong Kong (CN); Yoshiteru Nagai, Kyoto (JP); Tsuguki Noma, Kyoto (JP); Hosei Mitsuzawa, Kyoto (JP)

(73) Assignees: TDK Corporation, Tokyo (JP); Rohm Co., Ltd., Kyoto-shi (JP)

( * ) Notice: Subject to any disclaimer, the term of this patent is extended or adjusted under 35 U.S.C. 154(b) by 399 days.

(21) Appl. No.: 12/964,168

(22) Filed: Dec. 9, 2010

(65) Prior Publication Data

US 2012/0147717 A1   Jun. 14, 2012

(51) Int. Cl.
*G11B 11/00* (2006.01)
*G11B 5/127* (2006.01)
*G01R 31/00* (2006.01)

(52) U.S. Cl.
USPC ................ 369/13.13; 369/13.33; 29/603.01; 324/750.01

(58) Field of Classification Search
USPC ....... 369/13.02, 13.13, 13.32, 13.33; 360/59; 29/603.01, 603.07, 603.09, 603.19; 324/750.01, 324/750.05, 754.23; 257/48
See application file for complete search history.

(56) References Cited

U.S. PATENT DOCUMENTS

| | | | |
|---|---|---|---|
| 6,555,841 B1 * | 4/2003 | Sakushima et al. ............. 257/48 | |
| 7,359,152 B2 | 4/2008 | Matono et al. | |
| 7,391,227 B2 | 6/2008 | Inoue et al. | |
| 2005/0069266 A1 * | 3/2005 | Kouta et al. .................... 385/92 | |
| 2008/0002298 A1 | 1/2008 | Sluzewski | |
| 2008/0043360 A1 | 2/2008 | Shimazawa et al. | |
| 2011/0128827 A1 * | 6/2011 | Shimazawa et al. ........ 369/13.02 | |
| 2011/0157738 A1 * | 6/2011 | Shimazawa et al. ............ 360/59 | |
| 2011/0228653 A1 * | 9/2011 | Shimazawa et al. ........ 369/13.32 | |
| 2012/0073120 A1 * | 3/2012 | Shimazawa et al. ....... 29/603.07 | |
| 2012/0090162 A1 * | 4/2012 | Shimazawa et al. ....... 29/603.01 | |
| 2012/0139566 A1 * | 6/2012 | Shimazawa et al. ..... 324/750.01 | |

FOREIGN PATENT DOCUMENTS

| | | |
|---|---|---|
| JP | 2004-158067 A | 6/2004 |
| JP | 2005-291912 A | 10/2005 |
| JP | 2007-026551 A | 2/2007 |

* cited by examiner

*Primary Examiner* — Thang Tran
(74) *Attorney, Agent, or Firm* — Posz Law Group, PLC

(57) ABSTRACT

A plurality of laser diode units is tested in a bar state, each of the laser diode units in which a laser diode that includes a first electrode and a second electrode formed on surfaces facing each other and that is mounted on a mounting surface of a submount such that the first electrode faces the mounting surface of the submount. The method includes preparing a bar in which mounting areas each of which includes the laser diode unit formed thereon and dicing margins for separating the bar into the separate laser diode units are alternatively aligned along a longitudinal direction wherein a first pad electrically connected with the first electrode of the laser diode is disposed on the mounting surface of each of the mounting areas of the submounts and a second pad electrically connected to the first pad of either one of the mounting areas that are adjacent to the dicing margin is disposed on the mounting surface of each of the dicing margins of the submounts: contacting sheet-shaped probes to the second electrode and the second pad at a slantwise angle with respect to the second electrode and the second pad, and pressing the probes to the second electrode and the second pad while deforming the probes; and providing a potential difference between the second electrode and the second pad through the probes so that the laser diode emits laser light.

7 Claims, 11 Drawing Sheets

METHOD OF BURN-IN TESTING FOR THERMALLY ASSISTED HEAD

BACKGROUND OF THE INVENTION

1. Field of the Invention

The present invention relates to a method of burn-in testing for a thermally-assisted head. Specifically, the present invention relates to a method of performing the burn-in test on laser diode units in a bar state which are used for a thermally-assisted head.

2. Description of the Related Art

In accordance with high recording density of a hard disk device (HDD), performance improvement in a thin film magnetic head is demanded. As the thin film magnetic head, a composite type thin film magnetic head is widely utilized that has a structure in which a reproducing head having a magneto resistance effect element (MR element) for reading and a reading head having an inductive electromagnetic transducer for writing are laminated.

A recording medium for magnetic recording is made from a discontinuous medium where magnetic micro particles are assembled, and each magnetic micro particle has a single magnetic domain structure. Since recording areas (each bit) are composed of a plurality of the magnetic micro particles, boundaries of the recording areas are uneven. In order to enhance the recording density, the unevenness of the boundaries of the recording area should be reduced. For that, it is effective to reduce the size of the magnetic micro particles; however, when the size of the magnetic micro particles is reduced, thermal stability is deteriorated in accordance with the decrease in volume of the magnetic micro particles. In order to enhance the thermal stability, it is preferred to utilize a magnetic material having a large magnetic anisotropy constant Ku; however, this leads to a difficulty in recording information with a conventional magnetic head because coercive force of the magnetic recording medium increases when anisotropy energy of the magnetic micro particles is increased. To solve this problem, a method of recording is proposed, in which heat as well as a magnetic field are applied at the time of recording so that coercive force is reduced. Such a method is referred to as thermally assisted magnetic recording. The thermally-assisted magnetic recording is similar to optical magnetic recording; however, the space resolution is realized by light in the optical magnetic recording. On the other hand, the space resolution is realized by a magnetic field in the thermally assisted magnetic recording.

As an example of the above-described thermally assisted magnetic recording, the specification of US2008/0002298 discloses a thermally assisted head including a surface-emitting diode.

In thermally-assisted recording technology, it is important to generate a minute light spot and also to determine an installation portion and a way to install a light source (laser diode unit). The specification of US 2008/0043360 discloses a structure of a head in which a laser diode unit incorporating a laser diode is attached to a back surface (an opposite surface of an air bearing surface) of a magnetic head slider in which a recording element and a reproducing element are mounted. The structure is referred to as a composite magnetic head slider structure.

The composite magnetic head slider structure has advantages over the prior art. (1) Since an integrated surface of a magnetic head slider is orthogonal to the air bearing surface, the composite magnetic head slider structure has an affinity for a head manufacturing process of a conventional hard disk device; (2) since a light source is positioned far away from the air bearing surface, a laser diode is less likely to receive a direct mechanical shock during operation of a hard disk device; and (3) since optical fiber and optical pick up lens are not utilized, cost is low and the number of manufacturing steps is small.

Also, the composite magnetic head slider structure has, in principle, a merit that characteristics of the laser diode and the magnetic head slider may be separately assessed. When the laser diode and the magnetic head slider are formed on one wafer in a wafer process and when either the laser diode or the magnetic head slider has a failure, its magnetic head should be treated as defective. Therefore, the yield rate may be decreased compared to the conventional magnetic head including only a magnetic head slider. On the other hand, with the composite magnetic head slider structure, it is possible to perform the testing on the laser diode by itself before the laser diode is mounted on the magnetic head slider. Therefore, since the defective laser diode may be eliminated and only a non-defective laser diode may be mounted on the magnetic head slider, the same yield rate as the conventional magnetic head may be maintained.

For the characteristic assessment of laser diode, a burn-in test is effective. The burn-in test measures and assesses variation over time under a high temperature situation and a current passage situation while a current passes through the laser diode.

When performing the characteristic assessment of the individual laser diode, the same as in the case of the head, it is preferable to perform the characteristic assessment and a reliability assessment by a unit of bar, namely in a state where laser diodes are aligned in a row. The laser diode is manufactured in the wafer process as in the magnetic head slider. Therefore, it is possible to manufacture a bar by cutting a wafer out. It requires a few hours to a few dozen hours to assess one laser diode with the burn-in test. Accordingly, performing the characteristic assessments of a large number of laser diodes at one time allows reduction of assessment cost, handling steps and time. When a length of a bar is approximately 80 mm, which is the length used in a manufacturing process of a conventional head, it is possible to dispose 100-200 pieces of laser diode on one bar.

FIG. 1A is a conceptual view illustrating characteristic assessment of laser diodes. The rightmost section of a bar 45 of submounts 133 illustrates a state where a laser diode 32 is separated from the submount 133. A laser diode unit 31 includes the submount 133 and the laser diode 32 mounted on the submount 133. The submounts 133 in the bar 45 state are held by a metallic fixture 53. The laser diode 32 includes electrodes 32a and 32b formed on a surface facing the submount 133 and an opposite surface thereof. A pad 44 is disposed on a surface of the submount 133 that faces the electrode 32a of the laser diode, and the pad 44 is electrically connected with the laser diode 32. The pad 44 is electrically connected with a drawing pad 44a. When probes 158 contact the drawing pad 44a and the electrode 32b to supply a current to the laser diode 32, the laser diode 32 emits laser light. The characteristics of the laser diode 32 are assessed by measuring light intensity of the laser light.

A conventional metallic needle is used as the probe 158 that supplies a current to the laser diode. However, there are disadvantages that the metallic needle is expensive and gives excessive mechanical stress to the laser diode. Specifically, for the test with the unit of bar, it is required to attach hundreds of the probes 158 on one card that holds the probes. Therefore, not only is the price of the probe itself expensive, but also all probes must be replaced when even one piece has a contact failure, which is not economical.

As illustrated in FIG. 1B, it may be considered to use cheap sheet probes 158', which are used in a working process of the head. When performing the burn-in test using the sheet probes 158', the sheet probes 158' are disposed to be inclined at an angle range from 30 degrees to 60 degrees with respect to the drawing pads 44a and the electrodes 32b to contact the drawing pads 44a and the electrodes 32b. The sheet probes 158' in which a large number of probes are integrated and each of the probes can move freely are common. Half of the probes 158' are pressed to the drawing pads 44a, and another half of the probes 158' are pressed to the electrodes 32b.

The purposes of the contact by the probes 158' is to provide an electrical contact and simultaneously to provide a preferable heat dissipation by contacting the bar 45 of the submounts 133 mounting the laser diodes 32 strongly with the fixture 53 supporting the bar 45. Therefore, the probes 158' preferably provide a pressing load of approximately 0.02 N (2 gf) or more, which is relatively high, to the laser diode unit 31; but, on the other hand, the laser diode 32 may be possibly damaged when the excessive pressing load is provided. Therefore, an upper limit of the pressing load of the probe 158' is desirably approximately 0.10N (10 gf).

The drawing pad 44a and the electrode 32b on the opposite surface of the laser diode have a height difference therebetween, which is the same thickness as a thickness D of the laser diode 32. Therefore, there is a large difference of the deformation pattern between the probe 158' pressed to the drawing pad 44a and the probe 158' pressed to the electrode 32b on the opposite surface of the laser diode 32. On the other hand, since the thickness D of each lot of the laser diodes 32 varies in a range of a few tens of microns, the deformation pattern of the probes 158' also varies depending on the lot. Therefore, the following drawbacks occur.

For example, a case is considered in which the probe 158' contacts the electrode 32b on the opposite surface of the laser diode to give a proper pressing load. In this case, damage that the laser diode 32 receives may be possibly suppressed. However, when a lot is used whose thickness D of the laser diode 32 is thinner, the pressing amount at the drawing pad 44a is relatively increased so that a pressing load is increased. As a result, the probe 158' further deforms and slides on a surface of the drawing pad 44a, and thereby a contact point with the drawing pad 44a moves toward a front side of the sheet (illustrated by an arrow A). At worst, the probe 158' tears loose from the drawing pad 44a, and it becomes difficult to perform the burn-in test in which the sheet probe 158' stably contacts the drawing pad 44a. As described above, when the thickness of the laser diode 32 varies, it may become difficult for both the drawing pad 44a and the electrode 32b on the opposite surface of the laser diode to obtain the proper pressing load.

Such a drawback may be prevented, for example, when an extension part 44b is disposed with the drawing pad 44a and a length of the drawing pad 44a in a direction that the probe slides is extended. However, the size of the submount used for the thermally-assisted head is required to be small to the extent possible from a standpoint of flying stability of the head. Furthermore, since it needs to locate address information, etc. on the submounts, it is extremely difficult to dispose a drawing pad with a large area.

It is an object of the present invention to provide a method for performing a test on a plurality of laser diode units, each of in which a laser diode is mounted on a submount, in a bar state while solidly contacting a probe with a pad. Similarly, it is an object of the present invention to provide a bar of submounts that may be preferably used for the test.

SUMMARY OF THE INVENTION

An embodiment of the present invention is a method of testing a plurality of laser diode units in a bar state, each of the laser diode units in which a laser diode that includes a first electrode and a second electrode formed on surfaces facing each other and that is mounted on a mounting surface of a submount such that the first electrode faces the mounting surface of the submount. The method includes a step of preparing a bar in which mounting areas each of which includes the laser diode unit formed thereon and dicing margins for separating the bar into the separate laser diode units are alternatively aligned along a longitudinal direction wherein a first pad electrically connected with the first electrode of the laser diode is disposed on the mounting surface of each of the mounting areas of the submounts and a second pad electrically connected to the first pad of either one of the mounting areas that are adjacent to the dicing margin is disposed on the mounting surface of each of the dicing margins of the submounts: and a step of contacting sheet-shaped probes to the second electrode and the second pad at a slantwise angle with respect to the second electrode and the second pad, and pressing the probes to the second electrode and the second pad while deforming the probes; and a step of providing a potential difference between the second electrode and the second pad through the probes so that the laser diode emits laser light.

The second pad is disposed on a dicing margin. The dicing margin is removed when cutting a bar, and does not configure any part of a completed laser diode unit. Therefore, normally, nothing is disposed on the dicing margin. However, by utilizing the dicing margin as an installation area for the second pad, a size of the second pad can be set freely. Even when the probe slides on the second pad due to an excessive pressing force of the probe caused from a thickness variation among laser diodes, it becomes easy to maintain an electrical contact between the probe and the second pad.

According to another embodiment of the present invention, a bar of submounts including mounting surfaces on which a plurality of laser diodes, each of which includes a first electrode and a second electrode formed on surfaces facing each other, are to be mounted; includes mounting areas for mounting the laser diodes and dicing margins for separating the bar into the individual mounting areas that are alternatively aligned along a longitudinal direction. A first pad is disposed on the mounting surface of each of the mounting areas, the first pad being configured to be electrically connected with the first electrode of the laser diode when the laser diode is mounted on the mounting surface such that the first electrode faces the mounting surface; and a second pad is disposed on the mounting surface of the dicing margin, the second pad being electrically connected with the first pad that is in either one of the mounting areas that are adjacent to the dicing margin.

With the present invention, as described above, there is provided a method for performing a test on a plurality of laser diode units in a bar state while solidly contacting a probe with a pad. In each of the laser diode units, a laser diode is mounted on a submount. Similarly, with the present invention, a bar of the submounts that are preferably used for the test is provided.

The above and other objects, features and advantages of the present invention will become apparent from the following description with reference to the accompanying drawings which illustrate examples of the present invention.

DETAILED DESCRIPTION OF THE INVENTION

Initially, a configuration of a thin film magnetic head, a typical example to which the present invention is applied, will be explained.

Figure 1A:
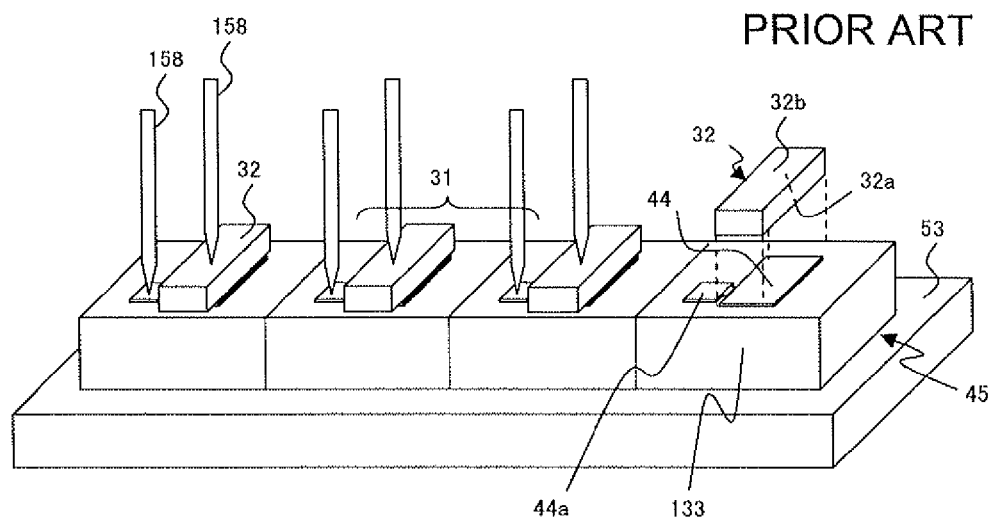
FIGS. 1A and 1B are conceptual views of a burn-in test of a laser diode unit.
Figure 1B:
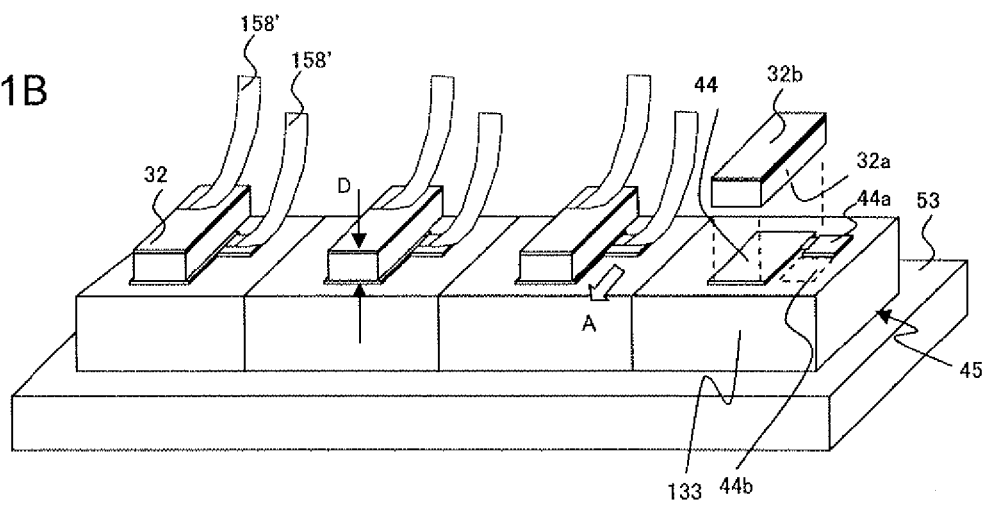
Figure 2:
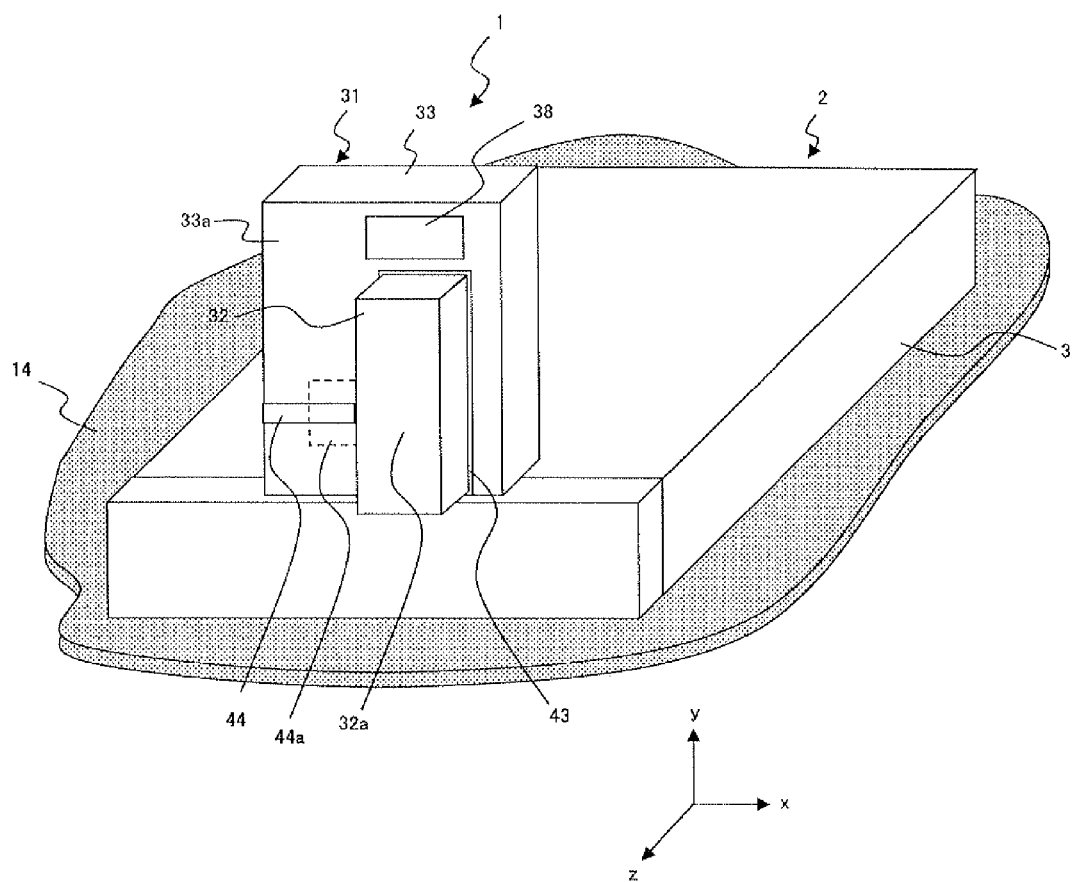
FIG. 2 is a conceptual perspective view of a magnetic head to which the present invention is applied.
Figure 3:
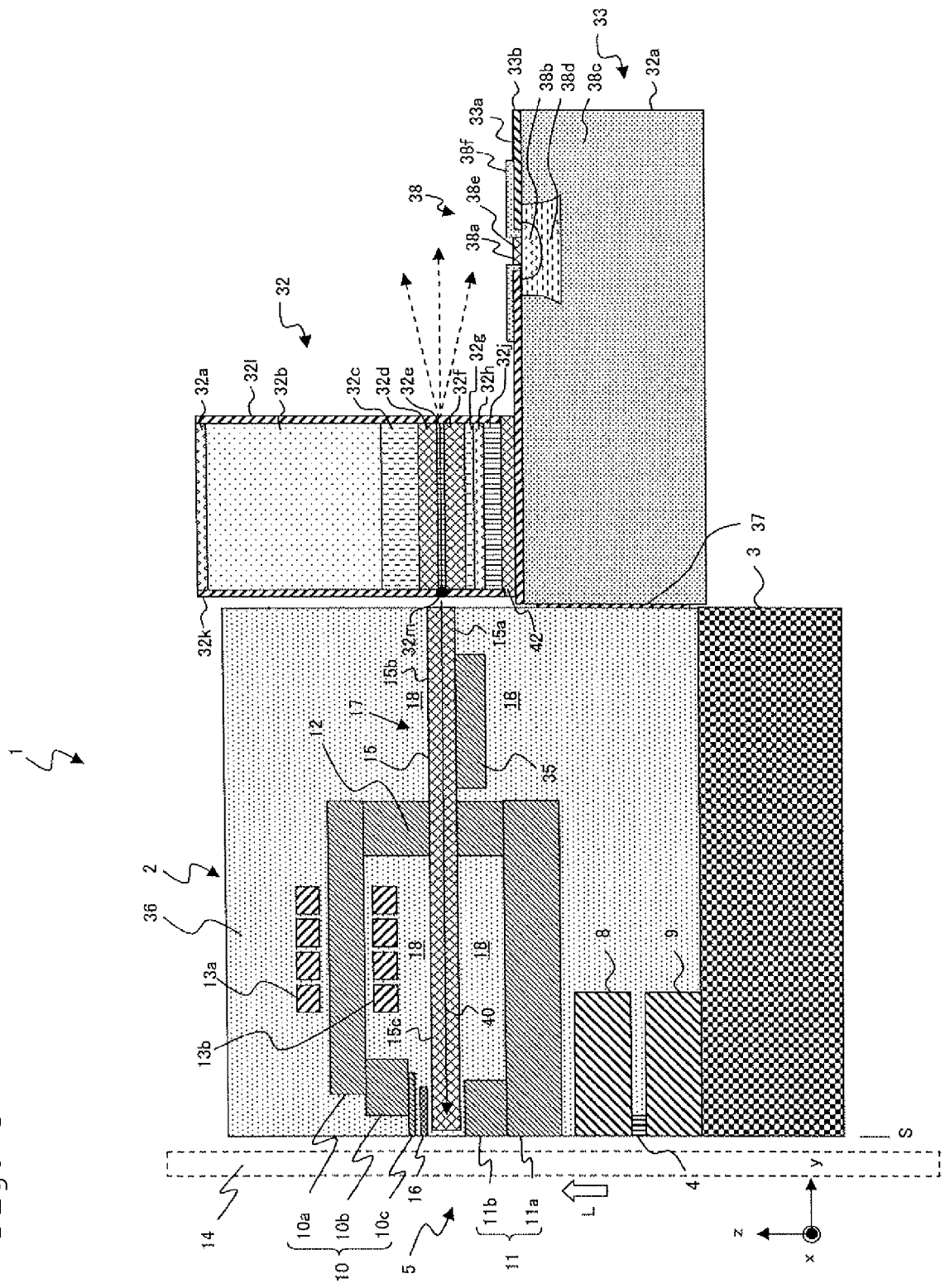
FIG. 3 is a main part cross-sectional view of the magnetic head illustrated in FIG. 2.
Figure 4:
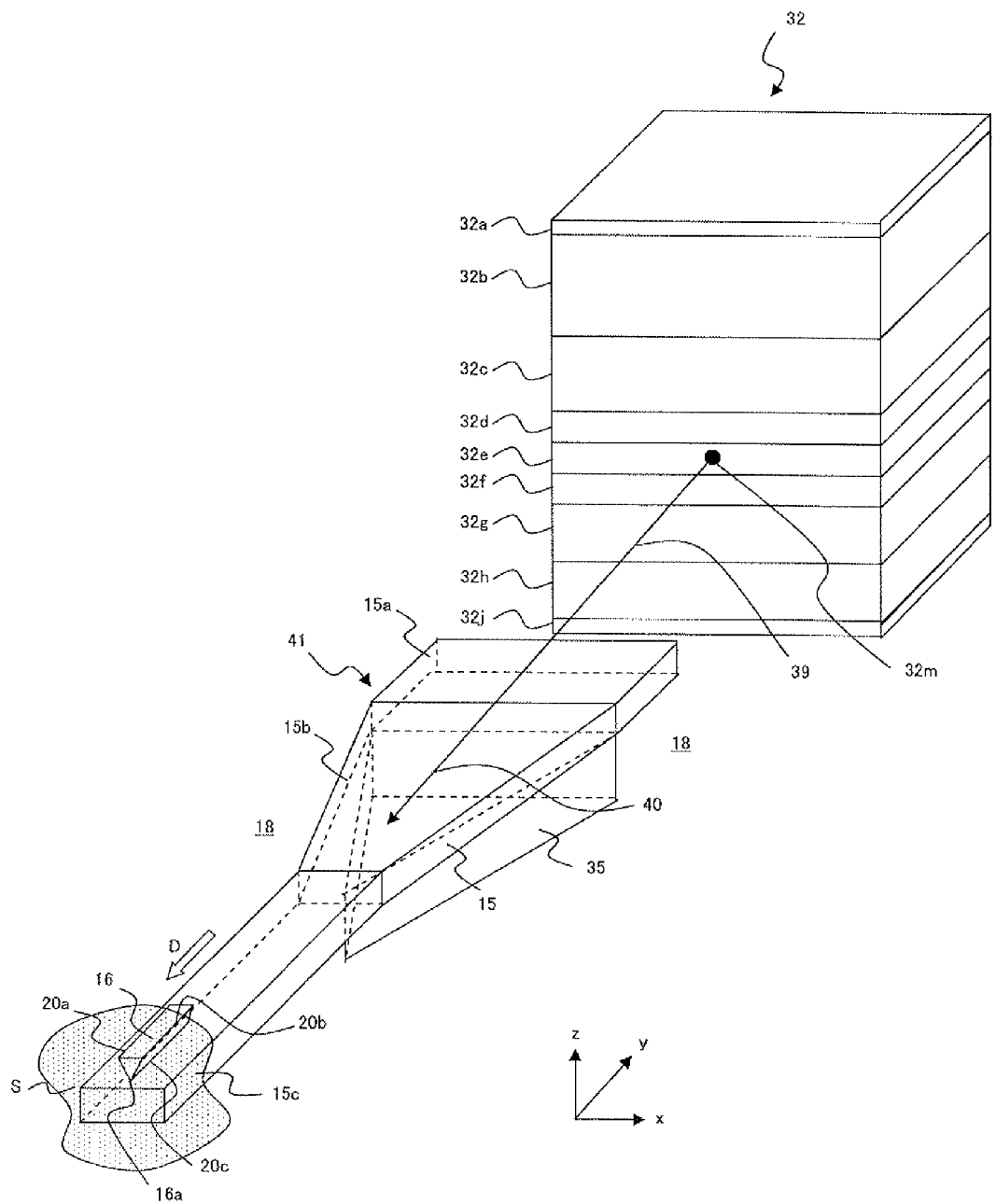
FIG. 4 is a conceptual perspective view of a near field generator and a laser diode.

The explanation regarding a magnetic head of the present invention will be given referring to the drawings. FIG. 2 is a total perspective view of the magnetic head of one embodiment of the present invention. FIG. 3 is a main part cross-sectional view of the magnetic head. FIG. 4 is a perspective view illustrating an extracted near field generator and laser diode. In this specification, a lamination direction L means a film formation direction in a wafer process and corresponds to the z-direction in each of the drawings. "Upward lamination direction" means a direction oriented toward an overcoat layer 36 from a substrate 3, and "downward lamination direction" means a direction oriented toward the substrate 3 from the overcoat layer 36.

The magnetic head 1 includes a magnetic head slider 2, and a laser diode unit 31 that emits laser light and that is firmly attached to the magnetic head slider 2.

The magnetic head slider 2 has a nearly hexahedral shape, and one surface of the six outer surfaces is an air bearing surface S facing the magnetic recording medium 14. The magnetic head slider 2 includes an MR element 4, a magnetic recording element 5 including a main pole 10 for recording, a waveguide 17 through which the laser light emitted from the laser diode unit 31 propagates as propagation light, and a near field generator 41 that generates near field light from the propagation light on the air bearing surface S. The main pole 10 is disposed adjacent to a near field generator 41 and an edge part thereof is positioned on the air bearing surface S. These elements are formed above the substrate 3.

The laser diode unit 31 is positioned on a surface of the magnetic head slider 2, which is an opposite side to the air bearing surface S. The laser diode unit 31 emits the laser light toward the waveguide 17 of the magnetic head slider 2 in a direction perpendicular to the air bearing surface S. The laser diode unit 31 is soldered to the magnetic head slider 2 via a bonding layer 37.

The magnetic head slider 2 includes the MR element 4 positioned such that a tip part is exposed to the air bearing surface S, and an upper shield layer 8 and a lower shield layer 9 that are disposed in a manner of sandwiching the MR element 4 from both upper and lower sides in the lamination direction. These elements configure a reproducing head part. The MR element 4 may be configured with an arbitrary configuration that uses magneto resistance effect such as a current in plane-giant magneto resistive (CIP-GMR) element where a sense current flows in a direction (x-direction) parallel to a film surface, a current perpendicular to plane-giant magneto resistive (CPP-GMR) element where a sense current flows in a direction (z-direction) perpendicular to a film surface, a tunneling magneto resistive (TMR) element for which a tunnel effect is used, etc. When the CPP-GMR element or the TMR element is applied, the upper shield layer 8 and the lower shield layer 9 are used as electrodes to supply a sense current.

The magnetic head slider 2 includes a magnetic recording element 5 for a so-called perpendicular magnetic recording, which configures a recording head part. The magnetic recording element 5 includes a main pole 10 for recording. The main pole 10 is disposed adjacent to a plasmon generator 16, which will be described later. The main pole 10 includes a first body part 10a, a second body part 10b, and a magnetic pole tip part 10c, all of which are made of an alloy etc., which is made of any two or three of Ni, Fe and Co. The magnetic pole tip part 10c, which is the edge part of the main pole 10, is positioned on the air bearing surface S. A return shield layer 11 is disposed in the downward lamination direction of the main pole 10. The return shield layer 11 includes a first body part 11a and a second body part 11b, both of which are also made of an alloy etc., which is made of two or three of Ni, Fe and Co. The main pole 10 and the return shield layer 11 are magnetically linked with each other by a contact part 12. In the present embodiment, the return shield layer 11 may be disposed in the downward lamination direction of the main pole 10; but, on the other hand, the return shield layer 11 may be also disposed in the upward lamination direction. An overcoat layer 36 made of $Al_2O_3$ is formed in the upward lamination direction of the main pole 10.

Coils 13a and 13b are wound around the main pole 10 centering on the contact part 12. FIG. 3 illustrates only a portion on the air bearing surface S side with respect to the contact part 12. Magnetic flux is generated at the main pole 10 by a current applied to the coils 13a and 13b from the outside. The coils 13a and 13b are formed of a conductive material, such as Cu, etc. The coils 13a and 13b are established in a configuration of two layers in the present embodiment; however, a configuration of one layer, three layers or more is also applicable. Further, the number of windings is four in the present embodiment; however, the number is not limited to four.

The main pole 10 is tapered at the pole tip part 10c in the vicinity of the air bearing surface S not only in the film surface orthogonal direction (the z-direction) but also in a track width direction (the x-direction). Magnetic flux generated in the main pole 10 is tapered as it travels toward the air bearing surface S, and the minute and strong magnetic flux for writing, which is suitable for high recording density, is discharged toward the magnetic recording medium 14 from the pole tip part 10c positioned on the air bearing surface S. The magnetic recording medium 14 has a configuration for perpendicular magnetic recording. The magnetic flux discharged from the pole tip part 10c enters into the magnetic recording medium 14 and magnetizes each recording bit in the perpendicular direction. The magnetic path of the magnetic flux 17 turns in an in-plane direction (the z-direction) of the magnetic recording medium 14. Furthermore, the direction of the magnetic flux 17 changes to the perpendicular direction (the y-direction) again in the vicinity of the return shield layer 11, and the magnetic flux 17 is absorbed by the return shield layer 11.

The second body part 11b of the return shield layer 11 forms a trailing shield part whose layer cross section is wider in the track width direction (the x-direction) than the first body part 11a. The placement of such a return shield layer 11 causes a steeper gradient of the magnetic field between the return shield layer 11 and the pole 10 in the vicinity of the air bearing surface S. As a result, signal output jitter is reduced and an error rate at the time of reading is decreased.

The magnetic head slider 2 includes a near field generator 41 that generates near field light. The near field generator 41 includes a core 15 through which laser light 39 generated in the laser diode unit 31 propagates as propagation light 40, a cladding 18 that covers the core 15 and that has a smaller refractive index than the core 15, and a plasmon generator 16 that, facing a part of core 15 and extending to the air bearing surface S along the core 15, generates the near field light on the air bearing surface S. The core 15 and the cladding 18 configure the waveguide 17.

The laser light 39 generated in the laser diode unit 31 propagates through the core 15 as the propagation light 40. The near field generator 41 of the magnetic head 1 generates the near field light on the air bearing surface S, and thereby the recording portion of the magnetic recording medium 14 is heated. A method in which the near field light is directly generated from the propagation light propagating through the core with a conductive plate-shaped member or a method in which the near field light is indirectly generated with a plasmon generator 16 (illustrated) may be applicable to the near field generator 41. The following explanation describes an embodiment in which the plasmon generator 16 is utilized.

The core 15 extends from an edge part, which is facing the laser diode unit 31, of the magnetic head slider 2 to the air bearing surface S or a vicinity thereof. A cross section of the core 15 orthogonal to the propagation direction D of the propagation light 40 is rectangular. "Thickness" of the core 15 means a size in the z-direction, and "width" of the core 15 means a size in the x-direction. The core 15 is arranged to have a width that is larger than its thickness.

When the wavelength of the laser light (propagation light) is 600 nm, the cladding 18 may be formed, for example, of $SiO_2$ and the core 15 may be formed, for example, of $Al_2O_3$. When the cladding 18 is formed of $Al_2O_3$, the core 15 may be formed, for example, of tantalum oxide (TaOx). When the wavelength of the laser light (propagation light) is 800 nm, the cladding 18 may be formed, for example, of $Al_2O_3$ and the core 15 may be formed, for example, of TaOx. TaOx means Titanium oxide with an arbitrary composition herein, and $Ta_2O_5$, TaO, $TaO_2$, etc. are typical; however, TaOx is not limited to these.

A cross section narrowing part 15b is formed in the vicinity of a starting point 15a of the core 15. The cross section of the cross section narrowing part 15b gradually narrows along the propagating direction D of the propagation light 40. Specifically, the cross section narrowing part 15b has a trapezoidal planar surface shape with a constant thickness and narrowing width. A spot diameter of the laser light that is introduced into the core 15 as the propagation light 40 is narrowed at the cross section narrowing part 15b.

The core 15 preferably includes a spot size converter 35 that tapers the spot diameter of the propagation light 40. The spot size converter 35 is formed of the same material as the core 15, and has a triangular prism shape that is integrated to the core 15. The spot diameter may be narrowed only by the cross section narrowing part 15b; however, a placement of the spot size converter 35 enables the spot diameter to be tapered more efficiently.

The core 15 on the other edge 15c side extends between the main pole 10 and the return shield layer 11. The core 15 ends in the vicinity of the air bearing surface S; however, the core 15 may also extend to the air bearing surface S. Although not illustrated in the drawings, the cladding 18 is disposed between the core 15 and the contact part 12.

The plasmon generator 16 extends to the air bearing surface S as facing a part of the core 15. The plasmon generator 16 is formed of Au, Ag, Cu, Al, Pd, Ru, Pt, Rh, Ir or of an alloy consisting primarily of these metals. The plasmon generator 16 is a metallic piece having a nearly triangular prism shape with triangular cross sections. Three apexes of the plasmon generator 16 on the triangular cross section that is orthogonal to the y-direction form respectively three edges 20a, 20b and 20c extending along the longitudinal direction (y-direction) of the plasmon generator 16. Thus, the plasmon generator 16 is formed such that one apex on the triangular cross section faces the core 15, and this apex forms the propagation edge 20c facing the core 15. A portion where the propagation edge 20c overlaps the core 15 is coupled with the propagation light 40 propagating through the core 15 in a surface plasmon mode, and generates surface plasmon. The generated surface plasmon propagates to an edge part 16a of the plasmon generator 16 through the propagation edge 20c, and the near field light is generated on the air bearing surface S.

The laser diode unit 31 includes a laser diode (or a light emitting diode) 32 and a submount 33 on which the laser diode 32 is mounted. The laser diode 32 is mounted on a mounting surface 33a of the submount 33. Specifically, a first electrode (p-electrode) 32j of the laser diode 32 is soldered (not illustrated) and firmly attached to a first pad 42 disposed on the mounting surface 33a of the submount 33. The submount 33 is made from a Si substrate, and its upper surface is covered with an insulation layer 33b made of $SiO_2$. This is because the submount 33 is connected with a cathode electrode of the photodiode 38 as will be explained below, and it is necessary to be isolated from the first pad 42.

The laser diode 32 is an edge emitting type, and laser diodes that are usually used for communication, optical disk storage or material analysis, such as laser diodes which are InP-based, GaAs-based, and GaN-based, etc., are applicable. A wavelength of the radiated laser light is not particularly limited; however, laser light having a wavelength in the range of 375 nm-1.7 μm can be used, and laser light having a wavelength of approximately 650 nm is preferably used.

Although the laser diode 32 is not limited to the following configuration, an example takes a configuration in which an n-electrode 32a that configures a second electrode, an n-GaAs substrate 32b, an n-InGaAlP cladding layer 32c, a first InGaAlP guide layer 32d, an active layer 32e which is formed with a multiplex quantum well (InGaP/InGaAlP), etc., a second InGaAlP guide layer 32f a p-InGaAlP cladding layer 32g, a p-electrode under layer 32h, and a p-electrode 32j that configures the first electrode are laminated in this order. On front and back sides of cleavage surfaces of the laser diode 32, reflecting layers 32k and 32l are formed to excite an oscillation by total reflection. An emission center 32m is positioned on the reflecting layer 32k and at the same height as the active layer 32e. The n-electrode 32a can be formed with Au or an Au alloy layer having a thickness of approximately 0.1 μm, which is formed on the n-GaAs substrate 32b.

As described above, the laser diode 32 includes the first electrode (p-electrode) 32j and the second electrode (n-electrode) 32a formed on surfaces that face each other. The first electrode (p-electrode) 32j is mounted on the mounting surface 33a in a manner facing the mounting surface 33a of the submount 33. The first electrode (p-electrode) 32j is connected with a connection wiring 44, which will be described later. The connection wiring 44 may be connected with an electric wiring disposed at a head gimbal assembly (not illustrated) supporting the magnetic head 1 by an appropriate method such as wire bonding, etc. As illustrated in FIG. 2, it may be also possible to dispose a broadened part 44a on a part of the connection wiring 44 and to be connected by the wire bonding. Similarly, the second electrode (n-electrode) 32a may be connected with the electric wiring of the head gimbal assembly by an appropriate method such as wire bonding. During the operation of the hard disk device, a current is supplied to the laser diode 32 from a power source of the hard disk device through the first electrode 32j and the second electrode 32a.

In the present embodiment, the laser diode 32 is bonded to the first pad 42 and the first electrode (p-electrode) 32j is at the bottom. The reasons are as follows. An active layer 32e is usually positioned closer to the first electrode (p-electrode) 32j than the second electrode (n-electrode) 32a in an edge emitting type laser diode, as seen from the lamination direction of the laser diode. Accordingly, self-beating of the laser diode 32 may be efficiently dissipated when the laser diode 32 is mounted on the submount 33 and the p-electrode is at the bottom (junction-down). A distance between the p-electrode and the active layer 32e, whose heating value during the operation is the largest, is smaller.

Since the laser diode 32 is a semiconductor element, output light intensity varies widely due to the variation of each element even when the constant power is supplied. Therefore, it is desired to determine power that provides appropriate laser light output at an initial setting of a hard disk device in which the magnetic head 1 is incorporated, and to supply the power determined at the initial setting to the laser diode 32 during the operation thereafter. Laser light emits also from an edge part of the active laser 32e on a side (distant side from the magnetic head slider 2) that is opposite to the emission center 32m in a stripe type laser diode as the broken lines illustrated in FIG. 3. Therefore, by detecting the intensity of the laser light, it is possible to assess intensity of the laser light emitted from the emission center 32m.

In order to detect the intensity of the laser light, the laser diode unit 31 includes a photodiode 38. Referring to FIG. 3, the photodiode 38 is formed on the submount 33, and the mounting surface 33a of the submount 33 is replaced with a light reception surface 38a. The submount 33 is electrically connected with a cathode electrode (not illustrated) of the photodiode 38. The photodiode 38 includes a p-type semiconductor layer 38b and an n-type semiconductor layer 38c that are formed by doping impurities on the Si substrate at high density, and an i-type semiconductor layer (intrinsic semiconductor layer) 38d, having a low impurity concentration, that is sandwiched by the semiconductor layers 38b and 38c. The p-type semiconductor layer 38b is positioned on the light reception surface 38a side, and is covered with an anti-reflection film 38e. The p-type semiconductor layer 38b is connected with an anode electrode 38f, and the n-type semiconductor layer 38c is connected with the cathode electrode. The p-type semiconductor layer 38b and the i-type semiconductor layer 38d are covered with the insulation film 33b made of $SiO_2$, and the anode electrode 38f is formed thereon. When each photon having larger energy than the band-gap energy of the i-type semiconductor layer 38d is irradiated, a pair of an electron and positive hole is generated in the i-type semiconductor layer 38d due to light absorption. When reverse bias voltage is applied to the photodiode 38, the electron and the positive holes are swept in antiparallel directions due to an electric field. The electron moves toward the n-type semiconductor layer 38c, and the positive holes move toward the p-type semiconductor layer 38b. Then, a photo-electric current is generated.

Next, a description of a method for burn-in test of the above-described laser diode will be given.

(Preparation of Bar of Submounts)

Figure 5A:
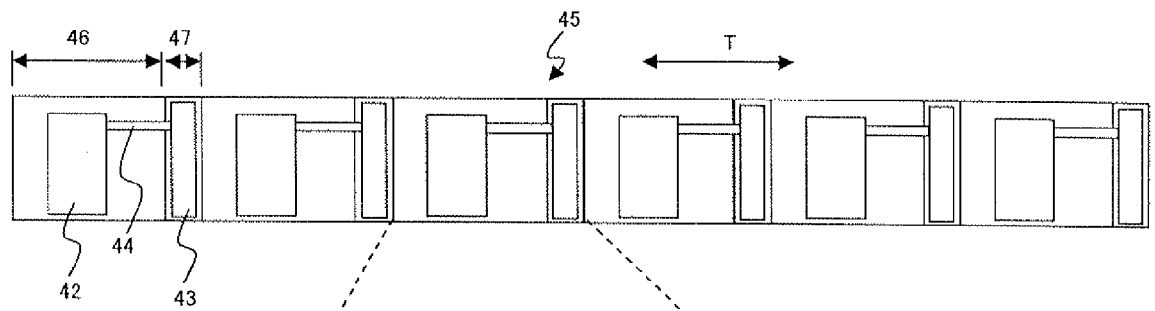
FIG. 5A is an upper surface view of a bar of submounts.
Figure 5B:
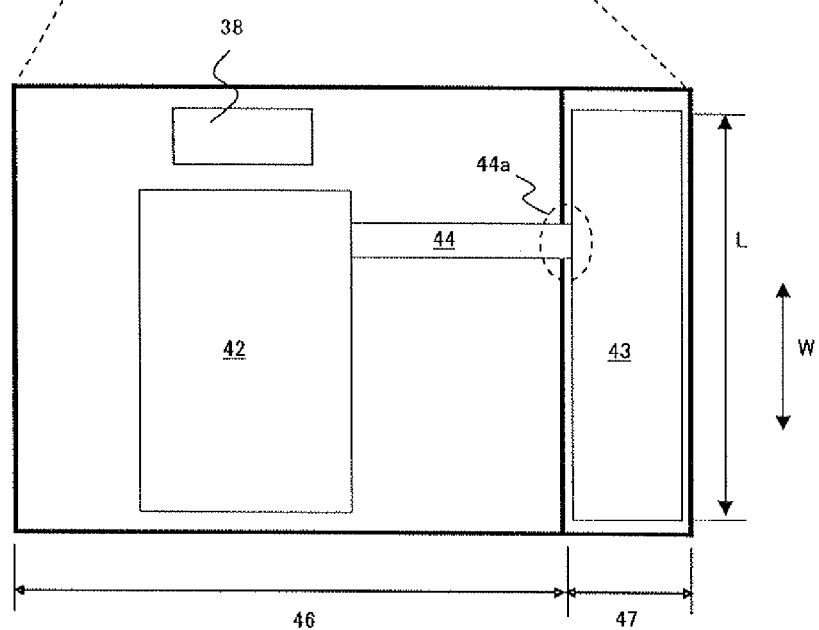
FIG. 5B is a partially enlarged view thereof.

A burn-in test is performed on a bar of the submount on which a plurality of the laser diodes is mounted. The bar of the submount illustrated in FIGS. 5A and 5B are prepared as in the following procedure. First, a photodiode 38 having the above-described film configuration is formed on a wafer of Si substrate (not illustrated) such that the mounting surface 33a on which the laser diode 32 is to be mounted is replaced with a light reception surface 38a. Also, the first pad 42 and the second pad 43 are formed on areas, corresponding to the laser diode unit 31, of the mounting surface 33a of the submount 33. Furthermore, the connection wiring 44 that electrically connects the first pad 42 with the second pad 43 is formed on the mounting surface 33a. After finishing the above-described steps, the wafer is cut into a bar 45 of the submount 33.

The manufactured bar 45 of the submount 33 has the following configuration. FIG. 5A is a plan view illustrating an extracted part of the bar. In the bar 45, the mounting area 46 where the laser diode unit 31 is formed and a dicing margin 47 for dicing the bar into each of the laser diode units 31 are alternately aligned in a longitudinal direction T. The figure illustrates only a few of the mounting areas 46 and the dicing margins 47; however, one actual bar has 100-200 pieces with the mounting area 46 and the dicing margin 47 as described above.

Referring to FIG. 5B that is an enlarged view, the first pad 42 that is electrically connected with the first electrode 32j of the laser diode 32 is disposed on the mounting surface 33a of the submount 33 in each of the mounting area 46. It is arranged so that the first pad 42 electrically is connected with the first electrode 32j of the laser diode 32 when the laser diode 32 is mounted on the submount 33 such that the first electrode 32j faces the mounting surface 33a. On the mounting surface 33a of the submount 33 of the dicing margin 47, the second pad 43 connected electrically with the first pad 42 is disposed. The mounting area 46 and the dicing margin 47 are arranged to become a pair, and the second pad 43 is arranged to become a pair with one mounting area 46 adjacent to the dicing margin 47, i.e., specifically, the first pad 42 of the mounting area 46 of the pair. The second pad 43 is electrically connected with the first pad 42 by the connection wiring 44 extending on the mounting surface 33. Furthermore, the photodiode 38 is formed on the mounting surface 33a.

(Manufacturing of Bar of Laser Diode Units 31)

Figure 6A:
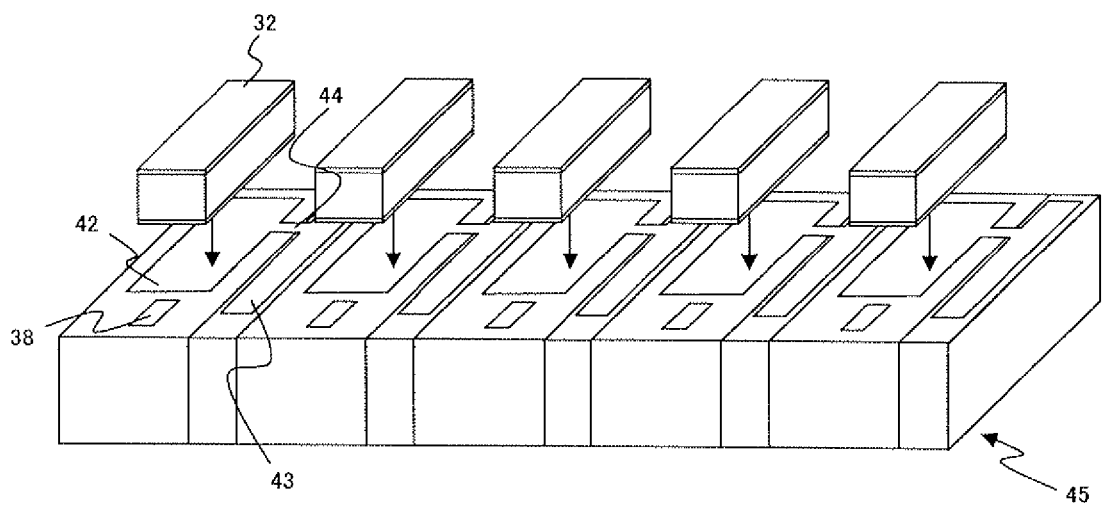
FIG. 6A is a conceptual perspective view of the laser diodes and the bar of the submounts prior to mounting the laser diodes.
Figure 6B:
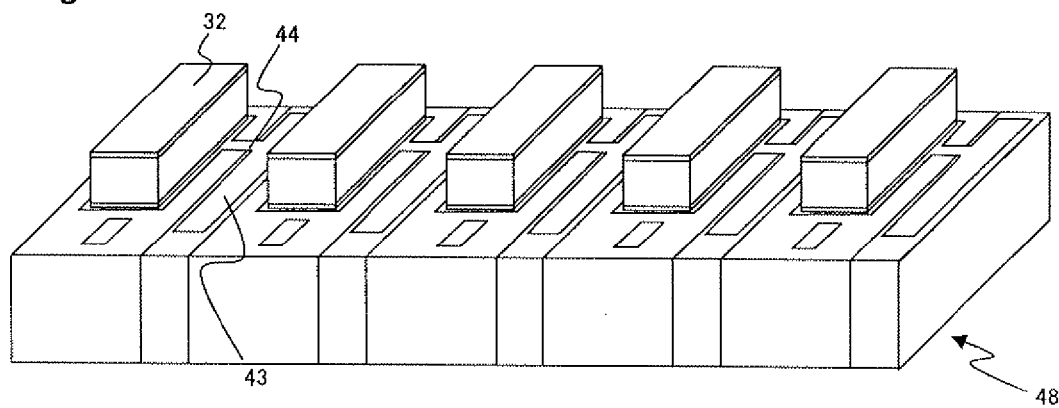
FIG. 6B is a conceptual perspective view of the laser diodes and the bar of the submounts subsequent to mounting the laser diodes.

Next, the laser diode 32 is mounted on the bar 45 of the submount 33, and a bar 48 of the laser diode unit 31 is formed. Specifically, the first pad 42 of the submount 33 and the p-electrode 32j of the laser diode 32 are soldered using AuSn alloy, etc, and firmly attached. As illustrated in FIGS. 6A and 6B, the p-electrode 32j of the laser diode 32 is electrically connected with the first pad 42, and also is electrically connected with the second pad 43 of the dicing margin 47 through the connection wiring 44.

(Contact of Probe)

Figure 7:
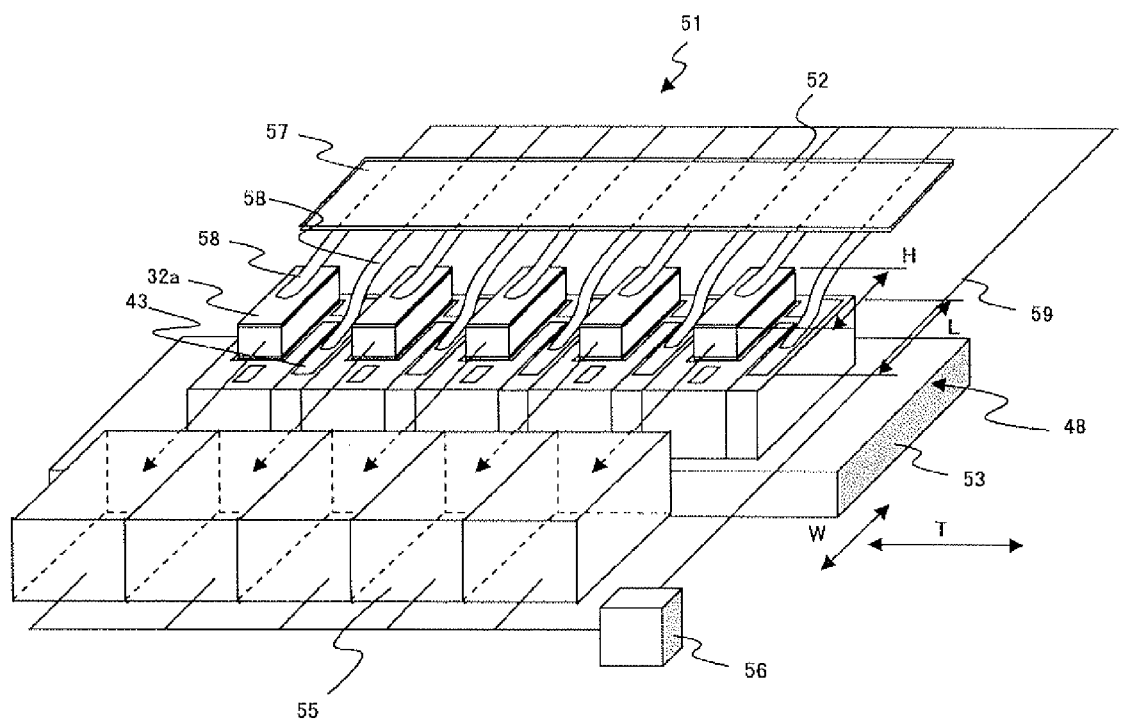
FIG. 7 is a conceptual view of the burn-in test of a laser diode unit of the present invention.

Next, a sheet-shaped probe 58 is contacted with the second electrode 32a and the second pad 43. Referring to FIG. 7, a burn-in test device 51 includes a fixture 53 for firmly attaching the bar 48, an integrated-type probe assembly 52 that is an assembly of sheet-shaped probes, a photodiode 55 firmly attached by the fixture 53, and a controller 56. The probe assembly 52 includes a body part 57 and a plurality of probes 58. Each of the probes 58 is disposed in a manner of branching from the body part 57, and may be deformed separately.

Figure 8A:
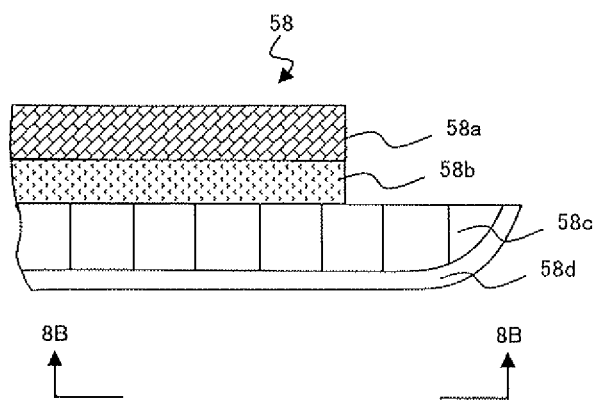
FIG. 8A is a cross-sectional view of a tip part of a probe.
Figure 8B:
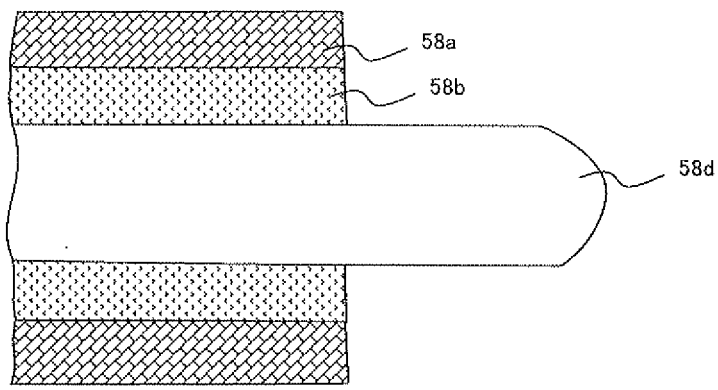
FIG. 8B is a bottom view of the tip part of the probe.

Referring FIG. 8, the probe 58 includes a base substrate 58a, an insulation layer 58b, a conductive layer 58c, and a conductive covering layer 58d. The base substrate 58a is made of an elastic material such as stainless, etc., and has a thickness of approximately 20 μm. The insulation layer 58b is formed on the base substrate 58a and made of an insulating material such as Polyimide, etc., and has a thickness of approximately 20 μm. The conductive layer 58c is made of a conductive material such as Cu, etc., and has a thickness of approximately 20 μm. The conductive covering layer 58d covers the conductive layer 58e, is made of Au, Au alloy, etc. by plating method, and has a thickness of approximately 10 μm. The conductive layer 58c on the side contacting the second electrode 32a and the second pad 43 is exposed from the base substrate 58a. The conductive layer 58c extends in the body part 57 of the probe assembly 52, and is connected with the controller 56 via a wiring 59 from the opposite side of the body part 57. As illustrated in FIG. 7, two probes 58 correspond to one laser diode unit 31, one of which contacts the second electrode 32a and the other of which contacts the second pad 43.

The probe assembly 52 includes the probes 58 to correspond every second electrode 32 and second pad 43, so that every laser diode 32 of the laser diode 31 may be tested simultaneously; however, it may be also possible to configure the probe assembly 52 in a manner of contacting some of the laser diodes 32.

During the test, potential difference is provided between the second electrode 32a and the second pad 43 from the controller 56 through the probe 58 (i.e., a current passes through the laser diode 32), and laser light emits from the laser diode 32. At this point, it is preferred that every laser diode 32 emits laser light simultaneously. When the probe assembly 52 is connected only with some of the laser diode units 31, the plurality of the connected laser diodes 32 (i.e., the laser diode 32 that has the second electrode 32a and the second pad 43 to which the probes 58 are pressed) emit laser light.

The photodiode 55 detects light output of the laser light emitted from the laser diode 32, and the controller 56 determines a current, which is required to obtain a predefined light output, to supply to the laser diode 32. Then, while the current supplied to the laser diode 32 is controlled to obtain a constant light output, the laser diode 32 is activated and the variation of the current supplied to the laser diode 32 is monitored. As a result, a laser diode 32 of which the supply current exceeds a threshold value after a certain interval is determined as defective.

With the above-described procedure, the burn-in test may be performed. Then, the bar 45 of the submount 33 on which the laser diode 32 is mounted may be diced along the dicing margin 47. The dicing margin 47 is used as a margin when the bar 45 is diced, and a diced-out submount 33 and the laser diode 32 mounted on the submount 33 configure a separated laser diode unit 31. The separated laser diode unit 31 is firmly attached to the above-described magnetic head slider 2, and the magnetic head 1 is manufactured.

Figure 9A:
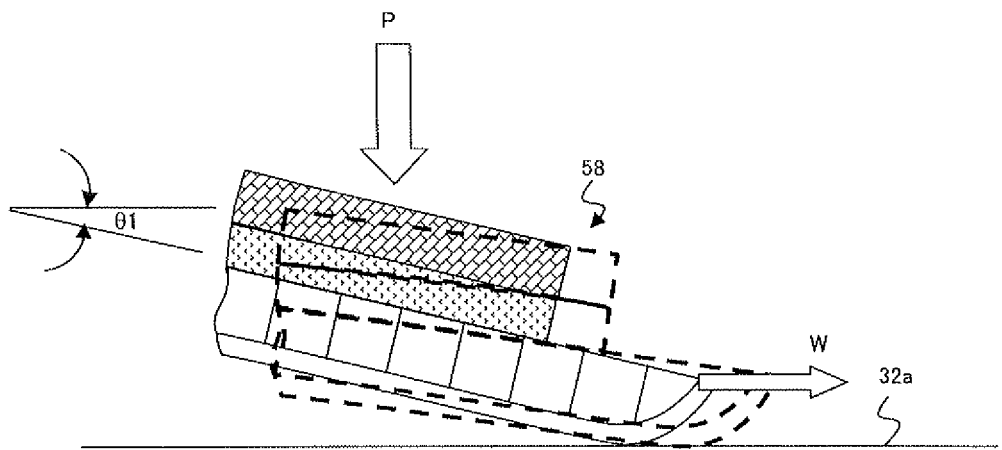
FIG. 9A is a conceptual view in which the tip part of the probe is pressed to an electrode.
Figure 9B:
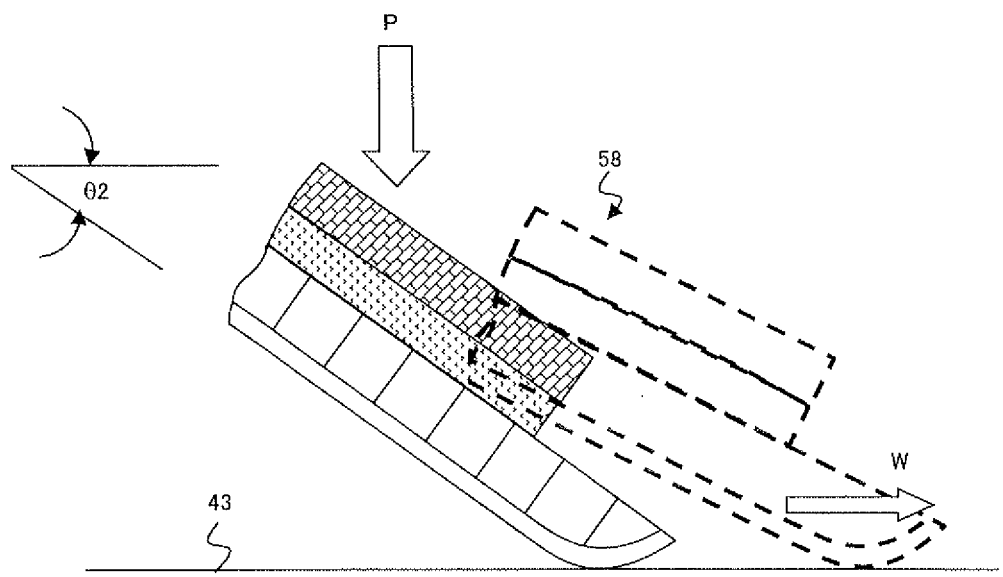
FIG. 9B is a conceptual view in which the tip part of the probe is pressed to a pad.

Herein, an explanation of the deformation of the probe 58 when each probe 58 of the probe assembly 52 contacts the second electrode 32a and the second pad 43 will be given. As described above, the probes 58 contact the second electrode 32a and the second pad 43, and the probes 58 are pressed at a predefined pressing force P. There is a difference in height between the second electrode 32a and the second pad 43, and the difference is the same as the thickness of the laser diode 32. FIG. 9A illustrates a state where the probe 58 contacts the electrode 32a. The probe 58, first, contacts the second electrode 32a at a slantwise angle θ1, and further the pressing force P is applied. Since the second electrode 32a is positioned in an upper position, the angle θ1 tends to become small, so that the probe 58 does not move a large amount in a direction W orthogonal to a longitudinal direction T even when the pressing force P is applied. FIG. 9B illustrates a state where the probe 58 contacts the second pad 43. Since the second pad 43 is positioned in a lower position, an angle θ2 tends to become large, so that the degree of the angle θ2 is drastically reduced and the probe 58 easily moves in the direction W when the pressing force P is applied.

However, since the second pad 43 is positioned in the dicing margin 47, it is easy to ensure a sufficient length L (see FIG. 7) in the direction W. Specifically, even if the contact point between the probe 58 and the second pad 43 moves a large amount in the direction W, the probe 58 rarely detaches from the second pad 43 as long as the length L has the same length as a length H of the laser diode 32 or more.

In the case of a configuration in which the laser diode unit 31 includes the photodiode 38 mounted thereon, it is desired that at least the boundary area 44a of the connection wiring 44 (see FIGS. 5B and 10A) is formed of a material with a high hardness. The boundary area 44a is defined as a region across the mounting area 46 and the dicing margin 47. The reasons are as follows.

Figure 10A:
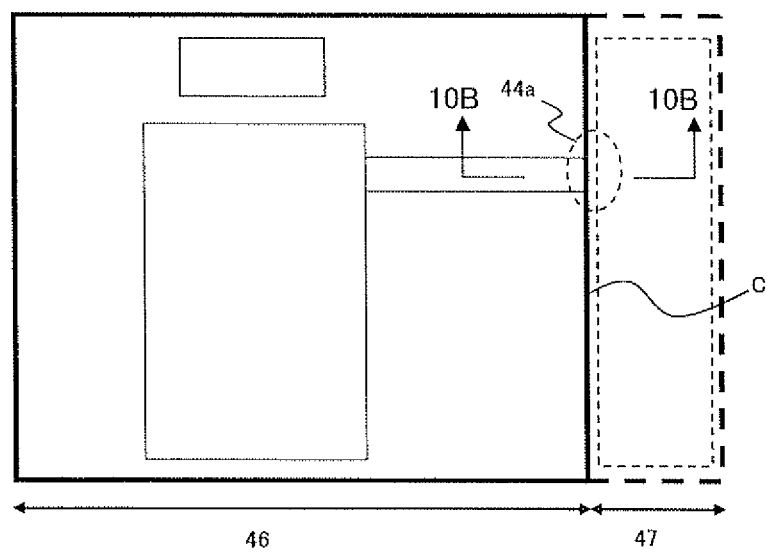
FIGS. 10A and 10B are a top plan view and a cross-sectional view of boundary area across a mounting area and a dicing margin.
Figure 10B:
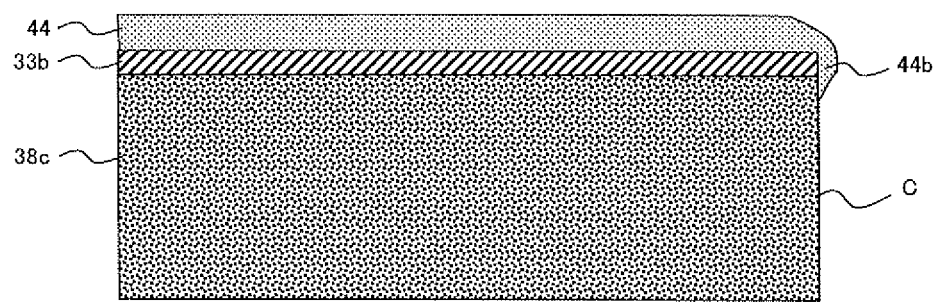

The laser diode unit 31 with a photo sensor function is formed of a Si substrate. The Si substrate (n-type semiconductor layer 38c) is connected with a cathode electrode of the photodiode 38. As illustrated in FIGS. 10A and 10B, the dicing margin 47 of the bar is diced and a section C emerges. The section C is polish-processed. When Au or Cu, which has a low hardness, is used as a material of the boundary area 44a that is disposed across the mounting area 46 and the dicing margin 47, as illustrated in FIG. 10B, the connection wiring 44 in the vicinity of the section C during the polishing process may occasionally be dragged on a polish surface of a polish table for the polishing process so that the connection wiring 44 stretches and a bridge 44b may be formed in a direction of a thickness of the substrate. As a result, a drawback occurs, such as a short-circuit between the connection wiring 44 and the n-type semiconductor layer 38c. The connection wiring 44 is electrically connected with the p-electrode 32j of the laser diode 32 and the n-type semiconductor layer 38c forms a cathode electrode part of the photodiode 38. Since the n-type semiconductor layer 38c is covered with the insulation layer 33b, such a failure becomes less likely to occur by thickening the insulation layer 33b. However, upon the performance of the photodiode 38, it is difficult to make the insulation layer 33 1 μm or more. With the insulation layer 33 that is thicker than this amount, the possibility for the Si substrate to warp due to stress is increased.

For the reasons described above, the connection wiring 44 at a polish-processed portion is desirably formed with a material that does not stretch and is diced easily. A polish-processed portion is, in other words, the boundary area 44a that is disposed across the mounting area 46 and the dicing margin 47. As its barometer, the Vickers hardness is desirably 100 or more. The boundary area 44a of the connection wiring 44 may be made of an alloy including gold and at least one element selected from Titanium, Nickel, or Copper. The whole area of the connection wiring 44 may be formed of such a material, and also the other area other than the boundary area 44a may be formed of a material having a small hardness such as Au, Cu, etc.

Figure 11:
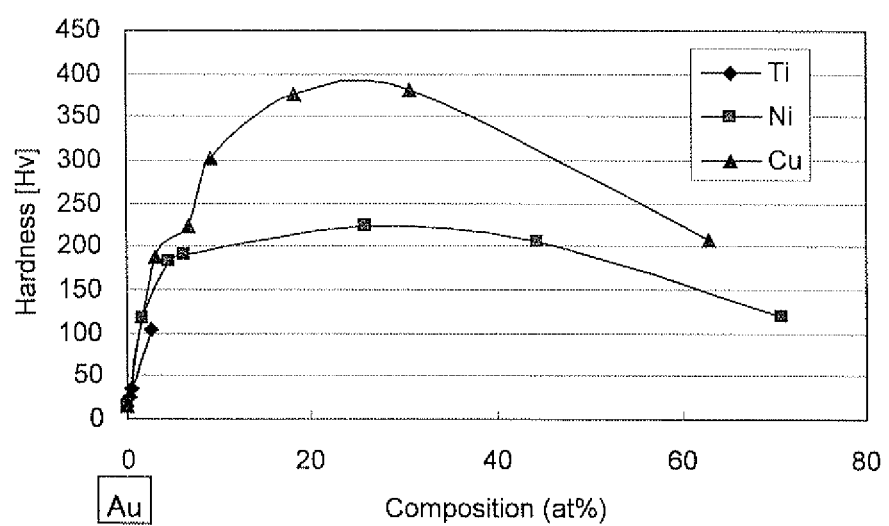
FIG. 11 is a graph illustrating a relationship between a composition of gold alloy and Vickers hardness.

FIG. 11 illustrates the Vickers hardness (HV) measured based on JIS Z 2244:2009. The Vickers hardness is obtained by dividing a test load F (N) of a variety of Au alloy by a calculated surface area S (mm$^2$). As a result of an experiment, the problem of short-circuit during the polishing process was prevented by using a material having the Vickers hardness of 100[HV] or more. The Vickers hardness of 100[HV] or more may be obtained when an atomic fraction of Titanium, Nickel, and Copper in Au alloy is at least 3% or more even though it is varied by element. As a material other than the Au alloy, Ti(110~155 HV), Ta(70~150 HV), W(~300 HV), and/or Ni(140~150 HV) is applicable.

As described above, according to the present invention, a characteristic assessment of a large number of laser diodes may be simultaneously and stably performed. As a result, a highly reliable thermally-assisted head may be provided economically.

While preferred embodiments of the present invention have been shown and described in detail, such description is for illustrative purposes only, and it is to be understood that changes and variations may be made without departing from the spirit or scope of the following claims.

What is claimed is:

1. A method of testing a plurality of laser diode units in a bar state, each of the laser diode units in which a laser diode that includes a first electrode and a second electrode formed on surfaces facing each other and that is mounted on a mounting surface of a submount such that the first electrode faces the mounting surface of the submount, comprising:
   a step of preparing a bar in which mounting areas each of which includes the laser diode unit formed thereon and dicing margins for separating the bar into the separate laser diode units are alternatively aligned along a longitudinal direction wherein a first pad electrically connected with the first electrode of the laser diode is disposed on the mounting surface of each of the mounting areas of the submounts and a second pad electrically connected to the first pad of either one of the mounting areas that are adjacent to the dicing margin is disposed on the mounting surface of each of the dicing margins of the submounts:
   a step of contacting sheet-shaped probes to the second electrode and the second pad at a slantwise angle with respect to the second electrode and the second pad, and pressing the probes to the second electrode and the second pad while deforming the probes; and
   a step of providing a potential difference between the second electrode and the second pad through the probes so that the laser diode emits laser light.

2. The method of testing according to claim 1, wherein, in the step of contacting the probes, a plurality of the probes are simultaneously pressed to the second electrodes and second pads of the plurality of the laser diodes, and
in the step of emitting laser light, each of the plurality of the laser diodes in which the probes are pressed to the second electrode and the second pad simultaneously emits laser light.

3. The method of testing according to claim 2, wherein, in the step of contacting the probes, the probes which are an integrated-type probe assembly in which each of the plurality of the probes may deform separately are simultaneously pressed to the second electrodes and the second pads of the plurality of the laser diodes.

4. The method of testing according to claim 1, wherein a length of the second pad in a direction orthogonal to the longitudinal direction is the same as or longer than a length of the laser diode.

5. The method of testing according to claim 1, wherein the submount includes a photodiode, mounted on the mounting surface, that receives laser light emitted from the laser diode and a connection wiring that extends on the mounting surface and electrically connects the first pad with the second pad,
the submount is electrically connected with a cathode electrode of the photodiode, and
at least an area across the mounting area and the dicing margin of the connection wiring is formed of a material having a Vickers hardness of 100 or more.

6. The method of testing according to claim 1, wherein the first electrode is a positive electrode and the second electrode is a negative electrode.

7. A method of manufacturing a magnetic head, comprising:
testing a plurality of laser diode units in a bar state based on the method of claim 1;
separating the tested bar of the laser diode units into separated laser diode units;
manufacturing the magnetic head by firmly attaching one of the separated laser diode units to a magnetic head slider that includes:
   a waveguide through which laser light emitted from the laser diode propagates as propagation light,
   a near field generator that generates near field light from the propagation light at an air bearing surface, and
   a main pole for recording that is disposed adjacent to the near field generator and of which an edge part is positioned on the air bearing surface.

* * * * *